United States Patent
Dharia et al.

(10) Patent No.: US 9,973,717 B1
(45) Date of Patent: May 15, 2018

(54) IMAGE SENSORS WITH ANTI-ECLIPSE CIRCUITRY

(71) Applicant: SEMICONDUCTOR COMPONENTS INDUSTRIES, LLC, Phoenix, AZ (US)

(72) Inventors: Nirav Dharia, Milpitas, CA (US); Pawan Gilhotra, Newark, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/392,384

(22) Filed: Dec. 28, 2016

(51) Int. Cl.
| | |
|---|---|
| *H04N 5/359* | (2011.01) |
| *H01L 27/146* | (2006.01) |
| *H04N 5/357* | (2011.01) |
| *H04N 5/378* | (2011.01) |

(52) U.S. Cl.
CPC ..... *H04N 5/3598* (2013.01); *H01L 27/14612* (2013.01); *H01L 27/14636* (2013.01); *H01L 27/14643* (2013.01); *H04N 5/3575* (2013.01); *H04N 5/378* (2013.01)

(58) Field of Classification Search
CPC .... H04N 5/3598; H04N 5/3575; H04N 5/378; H01L 27/14612; H01L 27/14636; H01L 27/14643
See application file for complete search history.

(56) References Cited

U.S. PATENT DOCUMENTS

| | | | | |
|---|---|---|---|---|
| 5,376,813 | A * | 12/1994 | Delbruck | H01L 27/1443 257/288 |
| 6,212,289 | B1 * | 4/2001 | Sarpeshkar | G06T 7/20 382/107 |
| 6,313,458 | B1 * | 11/2001 | Okamoto | H03G 3/3084 250/214 A |
| 7,053,356 | B2 * | 5/2006 | Boubal | H01L 27/14609 250/214 A |
| 7,075,130 | B2 * | 7/2006 | Delbruck | H03F 3/082 257/233 |
| 7,348,533 | B2 * | 3/2008 | Ko | H04N 5/361 250/208.1 |
| 8,390,712 | B2 * | 3/2013 | Xu | H04N 5/3745 250/208.1 |
| 8,625,012 | B2 * | 1/2014 | Yuan | H04N 5/35527 250/208.1 |
| 2006/0238634 | A1 | 10/2006 | Yan | |
| 2006/0278809 | A1 | 12/2006 | Takayanagi | |

(Continued)

*Primary Examiner* — Nicholas G Giles
(74) *Attorney, Agent, or Firm* — Treyz Law Group, P.C.; Joseph F. Guihan; Tianyi He

(57) ABSTRACT

An image sensor may include an array of image pixels arranged in rows and columns. Image pixels arranged along the same column may be coupled to a column line. The column line may be coupled to anti-eclipse control circuitry. In one suitable arrangement, the anti-eclipse control circuitry may include a comparator that compares the output signal on the column line to an anti-eclipse bias voltage. If, during a reset sampling period, the output signal on the column line is less than the anti-eclipse bias voltage, a transistor may be asserted that couples the floating diffusion region in the pixel to a power supply terminal. Using this arrangement, at least a minimum pixel level may be output when the eclipse condition is met and noise from the reset sample will correlated to noise in the incident light sample.

12 Claims, 8 Drawing Sheets

(56) References Cited

U.S. PATENT DOCUMENTS

| | | | |
|---|---|---|---|
| 2007/0023612 A1* | 2/2007 | Ko | H04N 5/361 |
| | | | 250/208.1 |
| 2010/0026838 A1* | 2/2010 | Belenky | H04N 3/155 |
| | | | 348/229.1 |
| 2012/0147237 A1* | 6/2012 | Xu | H01L 27/14609 |
| | | | 348/301 |
| 2015/0237275 A1 | 8/2015 | Iwata et al. | |
| 2016/0065868 A1 | 3/2016 | Olsen | |

* cited by examiner

IMAGE SENSORS WITH ANTI-ECLIPSE CIRCUITRY

BACKGROUND

This relates generally to imaging systems and, more particularly, to imaging systems having circuitry for handling the eclipse phenomenon.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels. The column circuitry often implements a correlated double sampling (CDS) procedure, which involves obtaining pixel signals by computing the difference between reset signals sampled during reset operations and image signals sampled following charge transfer operations.

The eclipse phenomenon occurs when at least some pixels are exposed to strong light such as direct illumination from the sun. The strong light may cause the floating diffusion to leak, which results in an erroneous reset signal being sampled (i.e., reset signals sampled during reset operations may exhibit voltage levels that are less than the desired reset level). Consequently, the pixel signal computed via CDS becomes an undesirably small value, the effect of which is manifested when an over-illuminated pixel appears dark when it should be bright.

It would therefore be desirable to provide improved imaging systems with circuitry for compensating errors caused by the eclipse phenomenon.

DETAILED DESCRIPTION

Figure 1:
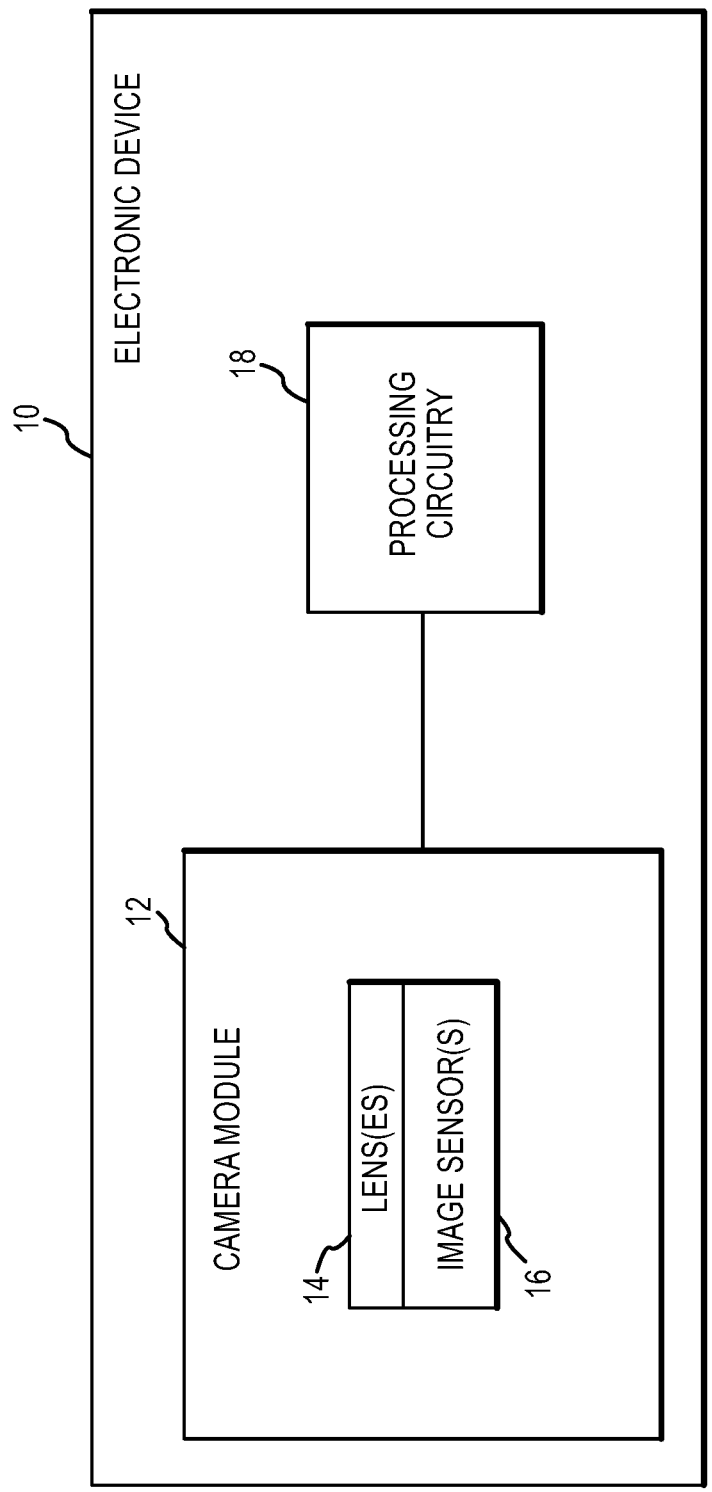
FIG. 1 is a schematic diagram of an illustrative electronic device that may include an image sensor in accordance with an embodiment of the present invention.

Embodiments of the present invention relate to image sensors with pixels that may have anti-eclipse circuitry. An illustrative electronic device that may include pixels with anti-eclipse circuitry is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
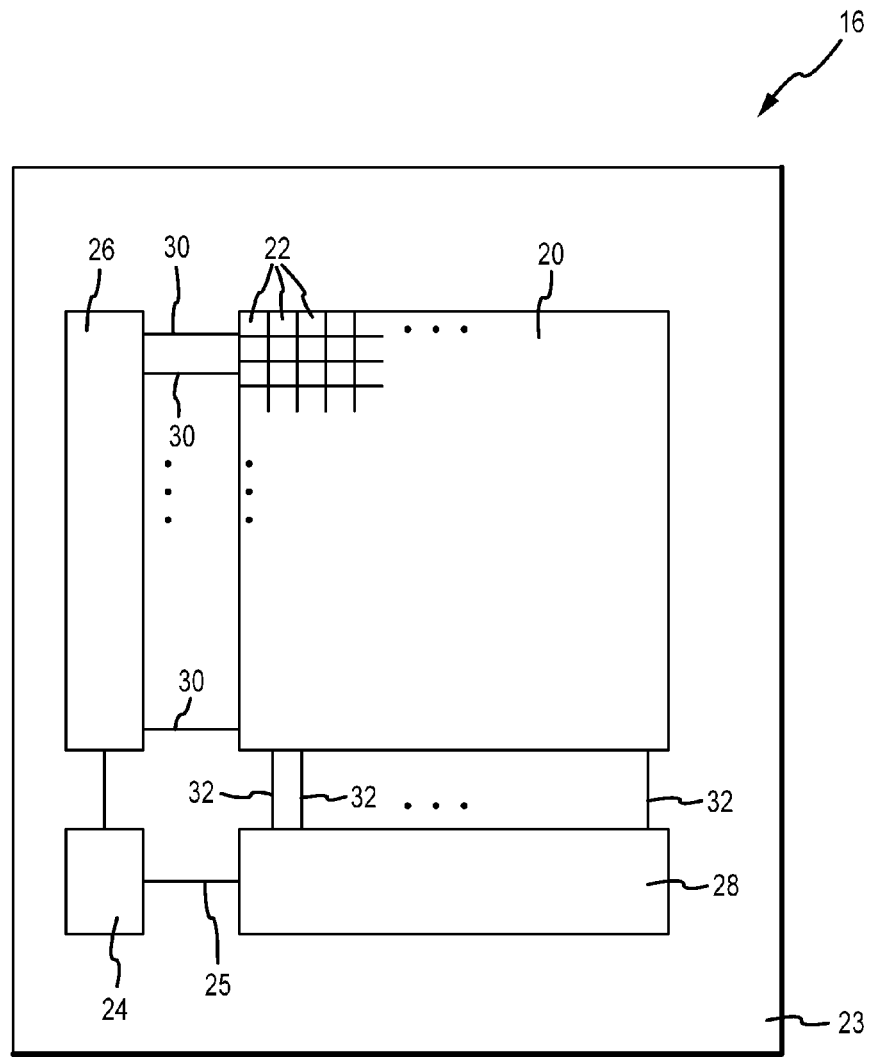
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
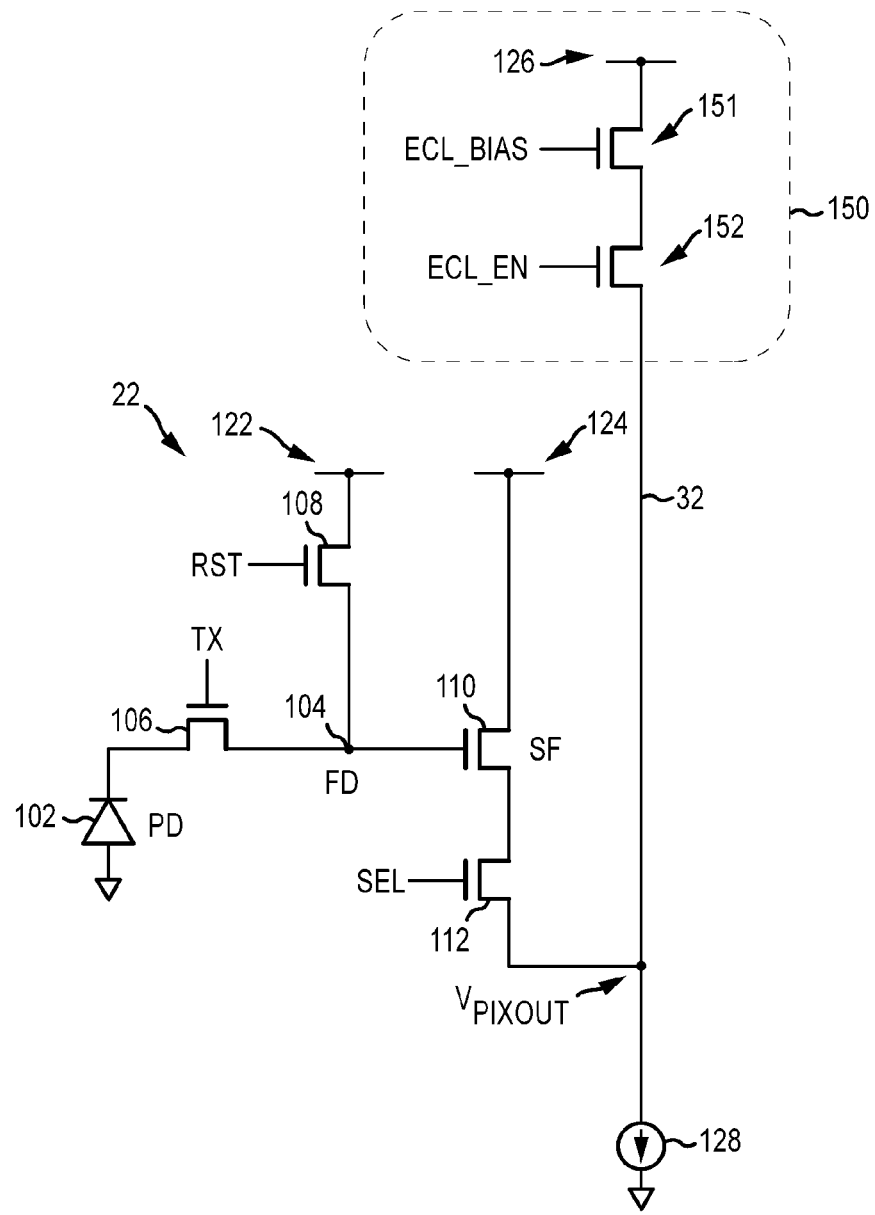
FIG. 3 is a circuit diagram of an image pixel that is coupled to anti-eclipse circuitry in accordance with an embodiment of the present invention.

FIG. 3 shows a diagram of an image pixel 22 that is coupled to anti-eclipse circuit 150. Pixel 22 includes a photodiode 102 (PD), a charge transfer gate 106, a floating diffusion node 104 (FD), a reset transistor 108, a source follower transistor 110 (SF), and a row select transistor 112. Photodiode 102 is coupled to floating diffusion node 104 via charge transfer transistor 106. Control signal TX can be driven high to allow charge accumulated in photodiode 102 to be transferred to node 104. Reset transistor 108 is connected between power supply terminal 122 and floating diffusion node 104. Power supply terminal 122 may be coupled to any desired bias voltage $V_{AAPIX}$ (e.g., 1.8 V, 2.8 V, between 1.5 V and 3.5 V, between 1 V and 6 V, greater than 1 V, less than 10 V, etc.). Reset transistor 108 may be turned on by driving reset signal RST high to drive node 104 to the $V_{AAPIX}$ reset level. Source follower transistor 110 and row select transistor 112 are coupled in series between power supply terminal 124 and column output line 32. Power supply terminal 124 may be coupled to any desired bias voltage $V_{AAPIX}$ (e.g., 1.8 V, 2.8 V, between 1.5 V and 3.5 V, between 1 V and 6 V, greater than 1 V, less than 10 V, etc.). Column output line 32 may be coupled to a current source such as current source 128. Transistor 110 may have a gate that is connected to node 104, whereas transistor 112 may have a gate that is controlled by row select signal SEL.

Signal SEL can be driven high to so that signals can be read out from pixel 22 onto the column output line. Voltage Vpixout on the column output line may represent the pixel signal at any given point in time during readout operations. As shown in FIG. 3, circuit 150 is connected to the column output line. In particular, circuit 150 includes transistors 151 and 152 connected in series between power supply terminal 126 and column output line 32. Power supply terminal 126 may be coupled to any desired bias voltage $V_{AAPIX}$ (e.g., 1.8 V, 2.8 V, between 1.5 V and 3.5 V, between 1 V and 6 V, greater than 1 V, less than 10 V, etc.). Transistor 151 may have a gate terminal that receives an anti-eclipse bias voltage (ECL_BIAS). The anti-eclipse bias voltage may be any desired voltage (e.g., 1.7 V, 2.7 V, between 1.5 V and 3.5 V, between 1 V and 6 V, greater than 1 V, less than 10 V, etc.). Transistor 152 may have a gate terminal that receives an anti-eclipse control pulse ECL_EN. Circuit 150 may help mitigate the negative effects of eclipse conditions on pixel data.

In eclipse conditions, excess charge in floating diffusion region 104 may result in a drop of voltage at the floating diffusion region. Because Vpixout is proportional to the voltage at the floating diffusion region, the eclipse conditions cause a voltage drop for Vpixout as well. Therefore, when the reset charge level is sampled, the reset charge level appears low. This causes the correlated double sampling readout from the photodiode to be inaccurate. Anti-eclipse circuit 150 helps this problem by clamping Vpixout to a given voltage during the reset sampling period. In FIG. 3, ECL_BIAS may be any desired voltage (e.g., 1.7 V, 2.7 V, between 1.5 V and 3.5 V, between 1 V and 6 V, greater than 1 V, less than 10 V, etc.). Anti-eclipse circuit 150 in FIG. 3 therefore ensures that the sampled reset charge level will have a minimum value (e.g., 1.7 V or another desired minimum value). Even if the floating diffusion region drops to a low value, Vpixout will remain at the minimum value due to anti-eclipse circuit 150. The operation of circuit 150 is described in further detail in connection with the timing diagram of FIG. 4.

As previously discussed, correlated double sampling (CDS) is used to correct for noise in imaging pixels. Voltage at the floating diffusion region may be sampled to determine the amount of incident light exposure for the imaging pixel. Ideally, all of the voltage at the floating diffusion region would be associated with the incident light. However, in reality, this is not the case and some of the voltage will be present due to noise. In order to isolate the voltage that comes from the incident light, correlated double sampling compares the reset voltage level at the FD to the sample voltage level at the FD. The reset voltage level is the amount of voltage that comes from noise, while the sample voltage level includes voltage from noise and incident light. The reset voltage level may be subtracted from the sample voltage level to isolate the amount of voltage associated with the incident light.

Figure 4:
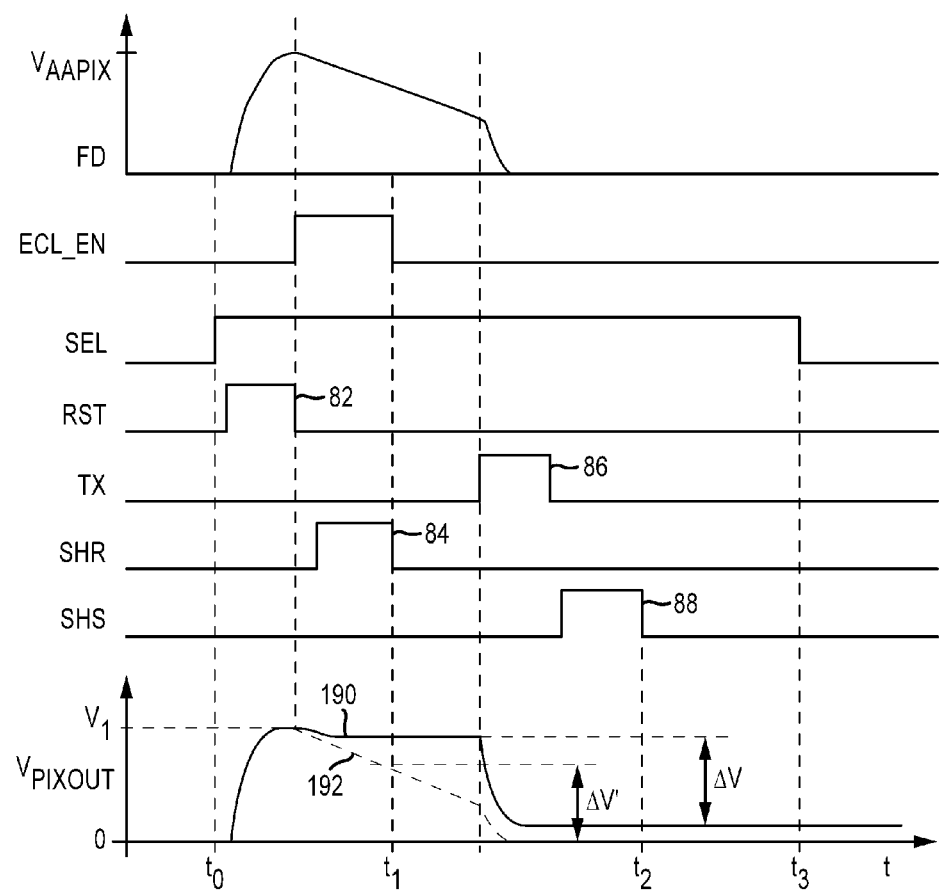
FIG. 4 is a timing diagram illustrating the operation of an image pixel with anti-eclipse circuitry such as the image pixel of FIG. 3 in accordance with an embodiment of the present invention.

FIG. 4 shows control signals that may be used in controlling image pixel 22 of FIG. 3. In the example of FIG. 4, pixel 22 is read out using a correlated double sample (CDS) scheme. At time t0, signal SEL is driven high to initiate a readout operation. Next, a reset pulse 82 activates reset transistor 108, which resets the voltage on floating diffusion node 104. Because the reset voltage of node 104 can vary, it is generally desirable to sample the reset voltage on nodes 104 so that the reset voltage can be subtracted from image signals at a later time. Sample and hold control signals (SHR) 84 may be asserted to sample and hold the reset voltage. A TX pulse 86 subsequently activates transfer transistor 106, which transfers image charges accumulated by photodiode 102 in response to incident light from photodiode 102 to floating diffusion node 104. Sample and hold control signals (SHS) 88 may be asserted to sample and hold the transferred charges in node 104. Associated image processing circuitry may then subtract the reset voltage from the accumulated charges to obtain the final pixel output. Signal SEL is then driven low at the end of the readout operation (at time t3).

FIG. 4 also shows the voltage waveform of floating diffusion region 104 and Vpixout on the column output line. Curve 190 shows the behavior of Vpixout during strong lighting (i.e., eclipse) conditions when anti-eclipse circuitry 150 is used, whereas curve 192 shows the behavior of Vpixout during strong lighting conditions when anti-eclipse circuitry is not used. As shown, in both cases the RST pulse 82 causes signal Vpixout to be driven high to $V_1$. When the anti-eclipse circuitry is not used (curve 192), Vpixout begins to drop due to excess charge in the floating diffusion region (that decreases the voltage at the floating diffusion region). The value of Vpixout when sampled at $t_1$ is substantially lower than the desired $V_1$. Vpixout is then sampled after charge transfer at $t_2$. The resulting CDS output (i.e., Vpixout value at t1-Vpixout value at t2) may be computed as value ΔV', a relatively low value given the strong lighting conditions. This undesirable effect is sometimes referred to as the eclipse phenomenon, where the center of a very bright object can appear dark while the outer edge appears bright.

If anti-eclipse circuitry 150 is used, ECL_EN may be enabled to assert transistor 152 during the reset sampling period. Accordingly, as shown in FIG. 4, even if the voltage of FD is dropping due to strong lighting conditions, when ECL_EN is asserted, Vpixout will be held at a minimum voltage level (e.g., 1.7 V or any other desired minimum voltage). When Vpixout falls below the minimum voltage (sometimes referred to as the "reset clip level"), transistor 152 conducts current and charges Vpixout up towards the minimum voltage (i.e., transistor 152 charges the column output line up to at least the minimum voltage). Therefore, when the value of Vpixout is sampled at t1, the value of Vpixout is at least the minimum voltage. Vpixout is then sampled again after charge transfer at $t_2$. The resulting CDS output (i.e., Vpixout value at t1-Vpixout value at t2) may be computed as value ΔV. By using the anti-eclipse circuitry, the calculated charge level (ΔV) is larger than when the anti-eclipse circuitry is not used (ΔV').

The anti-eclipse circuitry of FIG. 3 helps combat the negative effects of the eclipse phenomenon. However, using the anti-eclipse circuitry of FIG. 3 sometimes results in a reset charge level from circuit 150 being sampled (instead of the reset charge level from the floating diffusion region). The reset charge level is then used in combination with the charge level from the floating diffusion region 104 in a double sampling calculation. However, because the reset charge level used in the calculation is not actually from floating diffusion region 104, the calculation is not a true correlated double sampling calculation. This type of calculation may sometimes be referred to as an uncorrelated double sampling calculation. Using anti-eclipse circuitry and uncorrelated double sampling to obtain image data, while more accurate than using no anti-eclipse circuitry at all, may cause column fixed pattern noise (cFPN) due to pixel reset voltage variation from column to column. To obtain even more accurate image data, anti-eclipse circuitry may be used that prevents this type of column fixed pattern noise.

Figure 5:
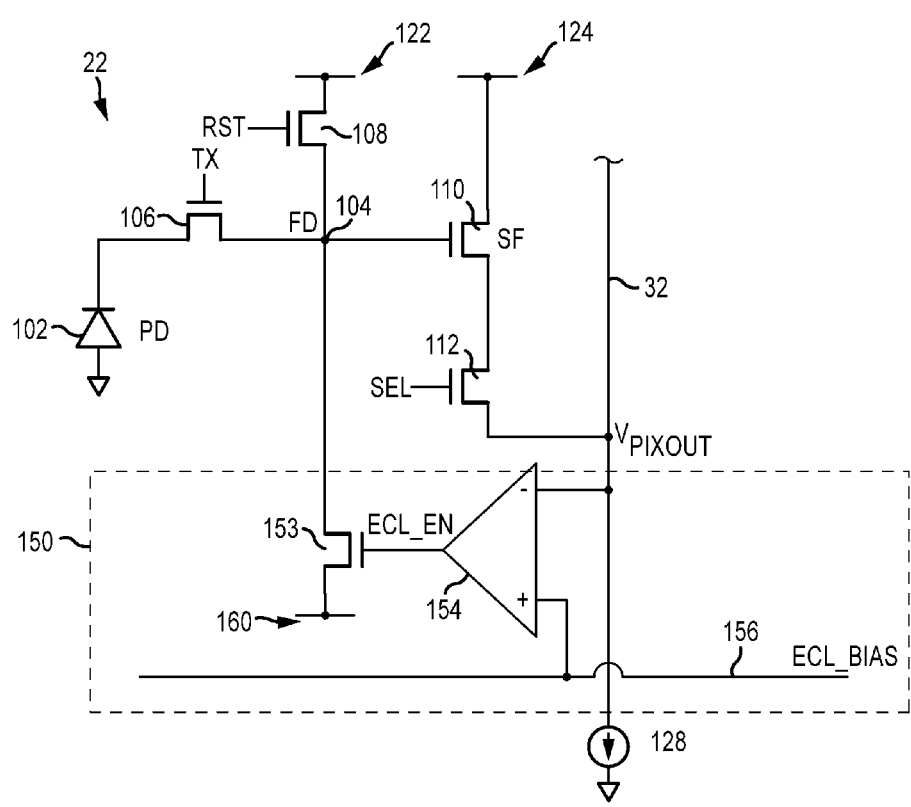
FIG. 5 is a circuit diagram of an image pixel that has anti-eclipse circuitry coupled to a floating diffusion region in accordance with an embodiment of the present invention.

FIG. 5 is a diagram of an illustrative image pixel with anti-eclipse circuitry that directly modifies charge in the floating diffusion region to account for strong lighting conditions while still ensuring correlated double sampling. Pixel 22 in FIG. 5 may have similar structures as pixel 22 in FIG. 3. In particular, as shown in FIG. 5 pixel 22 may include a photodiode 102 that is coupled to a floating diffusion region 104 by transfer transistor 106. Floating diffusion region 104 may be coupled to power supply terminal 122 by reset transistor 108. Floating diffusion region 104 may also be coupled to source follower transistor 110. Source follower transistor 110 may be coupled to power supply terminal 124. Row select transistor 112 may be coupled between source follower transistor 110 and column output line 32.

Anti-eclipse circuitry 150 in FIG. 5 may include a comparator 154. Comparator 154 may have a first input that is coupled to column output line 32 and a second input that is coupled to an anti-eclipse bias line 156. Therefore, the positive input (sometimes referred to as a positive terminal) of comparator 154 may receive a predetermined anti-eclipse bias voltage from anti-eclipse bias line 156. The negative input (sometimes referred to as a negative terminal) of comparator 154 may receive Vpixout from column output line 32. The comparator may compare the magnitude of Vpixout to the magnitude of the anti-eclipse bias voltage (ECL_BIAS) from bias line 156. Anti-eclipse bias voltage ECL_BIAS may sometimes be referred to as a threshold voltage. The output of comparator 154 may be an anti-eclipse enable signal (ECL_EN) that is provided to the gate of transistor 153. The anti-eclipse enable signal may have a value indicative of whether or not the anti-eclipse bias voltage is greater than Vpixout (e.g., signal ECL_EN may be asserted at a logic high level "1" if ECL_BIAS is greater than Vpixout whereas ECL_EN may be provided at a logic low level "0" if Vpixout is greater than ECL_BIAS). ECL_BIAS in FIG. 5 may be a lower voltage value than ECL_BIAS in FIG. 3.

The output of comparator 154 may be provided to the gate of transistor 153. Transistor 153 may be coupled between power supply terminal 160 and floating diffusion region 104. Power supply terminal 160 may be coupled to any desired bias voltage (e.g., 1.7 V, 2.7 V, between 1.5 V and 3.5 V, between 1 V and 6 V, greater than 1 V, less than 10 V, etc.). The comparator and transistor 153 may serve as a feedback loop to ensure the floating diffusion region stays at a minimum charge level. For example, in strong lighting conditions the voltage of floating diffusion region 104 may drop. This causes Vpixout to drop as well. If Vpixout drops below ECL_BIAS, the output of comparator 154 will assert transistor 153, coupling floating diffusion region 104 to power supply terminal 160. This will raise the charge at floating diffusion region 104 to approximately the bias voltage provided by power supply terminal 160. Vpixout will increase accordingly. If Vpixout increases higher than ECL_BIAS, transistor 153 will be deasserted and the floating diffusion region will no longer be coupled to power supply terminal 160. If still exposed to strong lighting conditions, the charge level at the floating diffusion region may continue to drop and the cycle may repeat. Ultimately, anti-eclipse circuitry 150 may be used to ensure that the charge level of floating diffusion region 104 stays above a minimum level during the reset sampling period. Additionally, with this type of anti-eclipse circuitry, Vpixout is always proportional to the charge level at the floating diffusion node (instead of being artificially modified as discussed in connection with FIG. 3). This way, the readout is ensured to be a correlated double sampling readout.

Comparator 154 may be any desired type of comparator. If desired, comparator 154 may be a comparator with hysteresis (e.g., a Schmitt trigger). Additionally, although FIG. 5 only shows one pixel, it can be understood that image sensor 16 may include one comparator per column output line (and therefore one comparator per column of pixels). Although there may be only one comparator per column, transistor 153 (which is controlled by the comparator) may be included in each pixel in the array.

Figure 6:
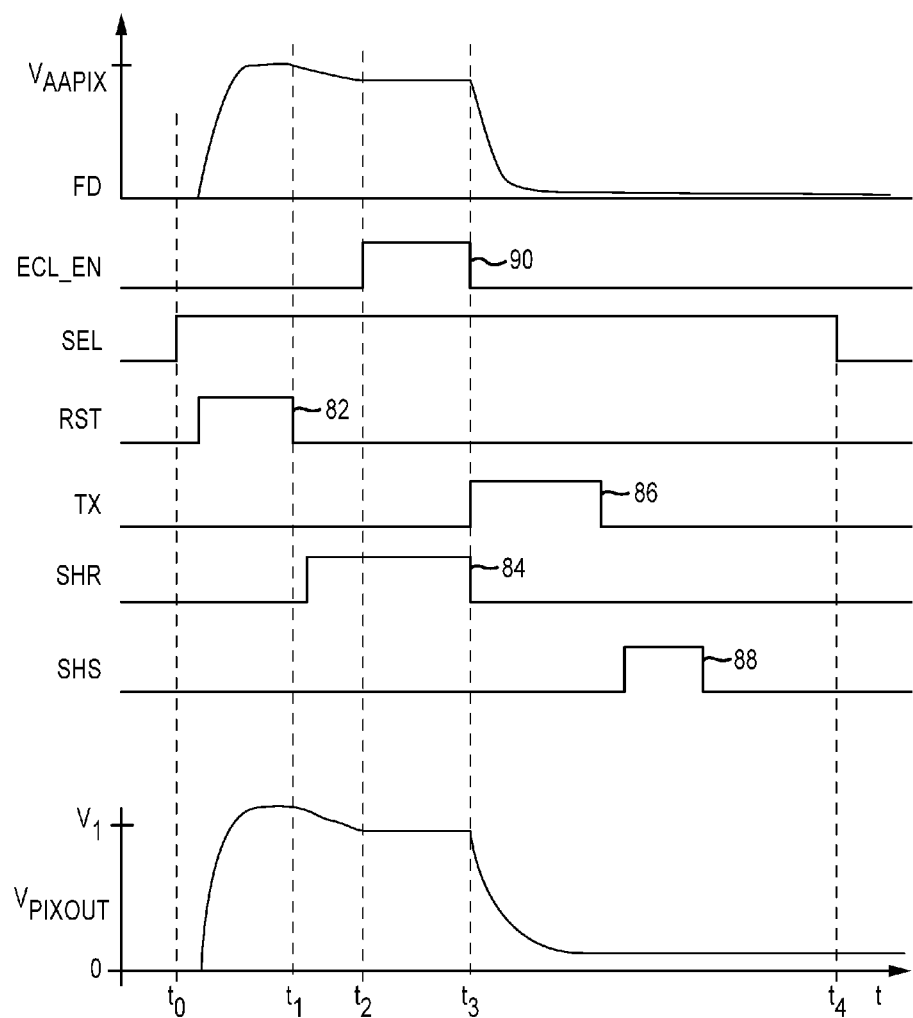
FIG. 6 is a timing diagram illustrating the operation of the image pixel of FIG. 5 in eclipse conditions in accordance with an embodiment of the present invention.

FIG. 6 is a timing diagram showing the operation of the illustrative anti-eclipse circuitry of FIG. 5. FIG. 6 shows operation of the anti-eclipse circuitry during strong lighting (i.e., eclipse) conditions. At time t0, signal SEL is driven high to initiate a readout operation. Next, a reset pulse 82 activates reset transistor 108, which resets the voltage on floating diffusion node 104. Because the reset voltage of node 104 can vary, it is generally desirable to sample the reset voltage on nodes 104 so that the reset voltage can be subtracted from image signals at a later time. Sample and hold control signals (SHR) 84 may be asserted to sample and hold the reset voltage. A TX pulse 86 subsequently activates transfer transistor 106, which transfers image charges accumulated by photodiode 102 in response to incident light from photodiode 102 to floating diffusion node 104. Sample and hold control signals (SHS) 88 may be asserted to sample and hold the transferred charges in node 104. Associated image processing circuitry may then subtract the reset voltage from the accumulated charges to obtain the final pixel output. Signal SEL is then driven low at the end of the readout operation (at time t4).

FIG. 6 also shows the voltage waveform of floating diffusion region 104 and Vpixout on the column output line. As shown, the assertion of reset transistor 108 with reset pulse 82 causes the voltage level in the floating diffusion region (FD) and Vpixout to increase. Due to the strong lighting conditions, at t1 when the reset transistor is deasserted, the voltage at the floating diffusion region may drop due to the strong incident light. The voltage of FD (and proportionally, Vpixout) may drop until Vpixout drops below ECL_BIAS at t2. As previously discussed, comparator 154 in FIG. 5 may compare Vpixout to ECL_BIAS from bias line 156. When Vpixout drops below ECL_BIAS (e.g., at t2), the output signal from the comparator (ECL_EN) will be asserted high at assertion 90. The high value of ECL_EN may cause transistor 153 to be asserted. The assertion of transistor 153 may set floating diffusion region 104 to a bias voltage from power supply terminal 160 (preventing the voltage of FD to further decrease).

Charge from the photodiode may be transferred to the floating diffusion region at t3 after the reset readout period concludes. At t3, transistor 153 may be deasserted to prevent undesirable interference with the sampling. If desired, comparator 154 may only be enabled during the reset sampling period (i.e., comparator 154 may only be enabled when the SHR signal is asserted). Comparator 154 may be enabled as soon as reset pulse 82 begins or as soon as reset pulse 82 ends, as examples. Comparator 154 may be disabled by the time the transfer signal TX is pulsed at 86. Transistor 153 may be deasserted when comparator 154 is disabled.

Any desired voltage level may be used for the anti-eclipse bias voltage ECL_BIAS or the voltage of power supply terminal 160 (e.g., 1.7 V, 1.8 V, 2.7 V, 2.8 V, between 1.5 V and 3.5 V, between 1 V and 6 V, greater than 1 V, less than 10 V, etc.).

Figure 7:
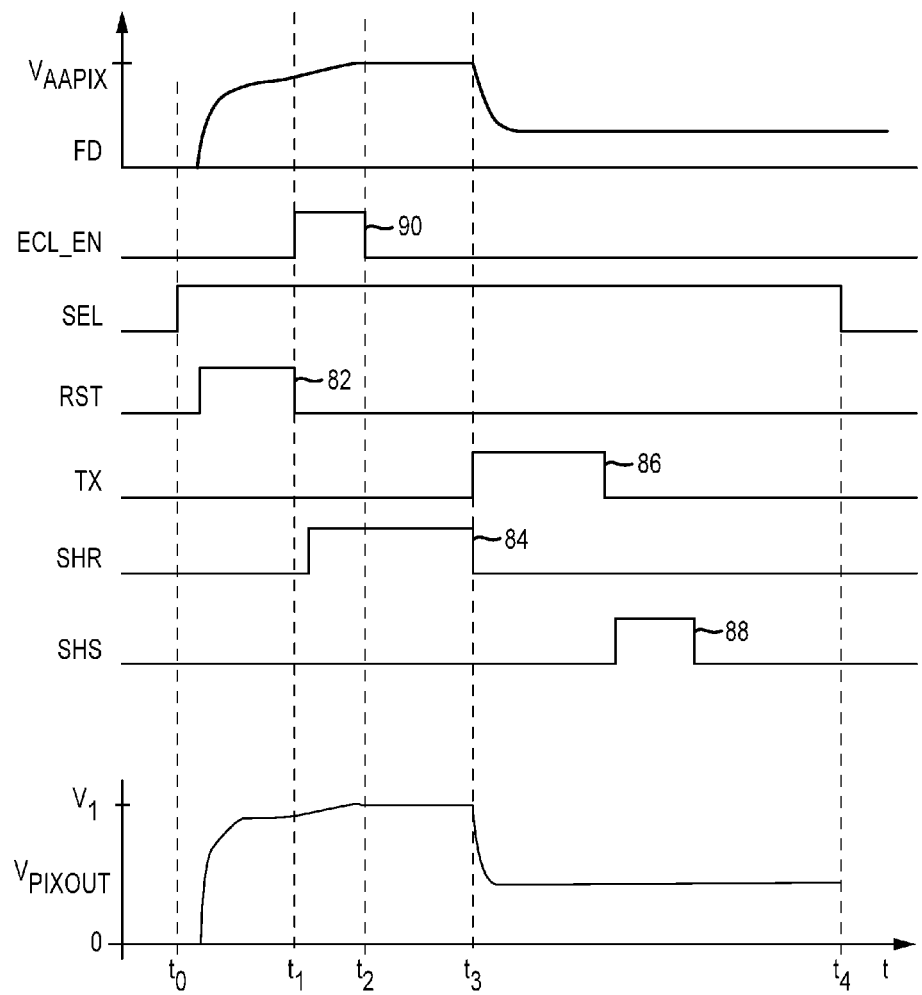
FIG. 7 is a timing diagram illustrating the operation of the image pixel of FIG. 5 in non-eclipse conditions in accordance with an embodiment of the present invention.

FIG. 7 is an illustrative timing diagram of the anti-eclipse circuitry of FIG. 5 in normal lighting (i.e., non-eclipse) conditions. FIG. 7 demonstrates a situation where the anti-eclipse circuitry of FIG. 5 has less noise than the anti-eclipse circuitry of FIG. 3. In FIG. 7, as in FIG. 6, signal SEL is driven high at t0 to initiate a readout operation. Next, a reset pulse 82 activates reset transistor 108, which resets the voltage on floating diffusion node 104. However, this example shows a scenario where the reset voltage on floating diffusion node 104 is low (due to the variance of the reset voltage). Accordingly, at t1 when the reset sampling period begins, Vpixout may be lower than the anti-eclipse threshold (even though there are normal lighting conditions). Because Vpixout is low (i.e., lower than ECL_BIAS), ECL_EN is asserted high at pulse 90 and transistor 153 is asserted. This raises the voltage at the floating diffusion region and Vpixout. Because there are normal lighting conditions, the voltage at the floating diffusion region may not drop after being initially raised, meaning that ECL_EN drops low at t2. At t3, after the reset sampling period has concluded, a TX pulse 86 activates transfer transistor 106, which transfers image charges accumulated by photodiode 102 in response to incident light from photodiode 102 to floating diffusion node 104. Sample and hold control signals (SHS) 88 may be asserted to sample and hold the transferred charges in node 104.

To summarize, due to variance in the reset voltage of the floating diffusion node, in certain scenarios it may incorrectly appear that eclipse conditions exist. By using the anti-eclipse circuitry of FIG. 5, the voltage at the floating diffusion region is modified directly. Therefore, when the reset charge sample is compared to the incident light charge sample, the amount of noise present is correlated. In other words, even if eclipse conditions are falsely diagnosed, there will be no negative effect on the accuracy of the readout. This is in contrast to the anti-eclipse circuitry of FIG. 3. If a similar scenario occurred using the anti-eclipse circuitry of FIG. 3, Vpixout would be modified. The floating diffusion node voltage, however, would not be modified. Vpixout is not proportional to the floating diffusion region voltage during reset in this scenario, causing an increase in noise when the double sampling calculation is performed. Unlike the anti-eclipse circuitry of FIG. 5, the anti-eclipse circuitry of FIG. 3 will have a negative effect on the accuracy of the readout if eclipse conditions are falsely diagnosed.

Figure 8:
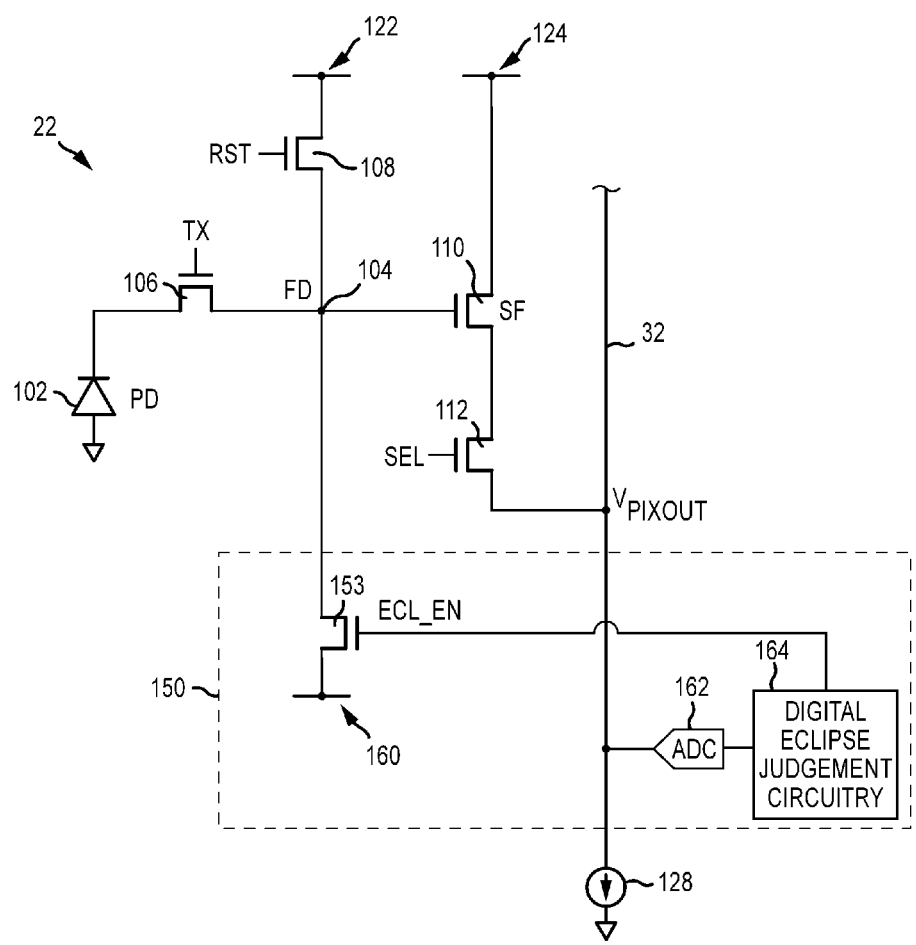
FIG. 8 is a circuit diagram of an image pixel that has digital eclipse judgement circuitry coupled to a floating diffusion region in accordance with an embodiment of the present invention.

The embodiments of FIGS. 3 and 5 show anti-eclipse circuitry in the analog domain. However, if desired similar concepts may be implemented in the digital domain. FIG. 8 shows an imaging pixel with illustrative digital anti-eclipse circuitry. Pixel 22 in FIG. 8 may have similar structures as pixel 22 in FIG. 5. In particular, as shown in FIG. 8 pixel 22 may include a photodiode 102 that is coupled to a floating diffusion region 104 by transfer transistor 106. Floating diffusion region 104 may be coupled to power supply terminal 122 by reset transistor 108. Floating diffusion region 104 may also be coupled to source follower transistor 110. Source follower transistor 110 may be coupled to power supply terminal 124. Row select transistor 112 may be coupled between source follower transistor 110 and column output line 32.

Anti-eclipse circuitry 150 in FIG. 8 may include an analog-to-digital converter (ADC) 162 that is coupled to column line 32. The ADC may be used to sample Vpixout. The converted value of Vpixout may be passed to digital eclipse judgement circuitry 164. Digital eclipse judgement circuitry may determine if eclipse conditions are present and control transistor 153 accordingly. Digital eclipse judgment circuitry may output control signal ECL_EN to assert transistor 153 when eclipse conditions are present. Transistor 153 may be operated in a similar fashion as transistor 153 in FIG. 5, except with digital eclipse judgement circuitry 164 sending the control signal instead of a comparator. Instead of using an anti-eclipse bias voltage ECL_BIAS as shown in FIG. 5, digital eclipse judgement circuitry may have a stored threshold that is used to help determine when eclipse conditions are present. There may be one ADC and digital eclipse judgment circuit per column of pixels in the array.

In various embodiments, an imaging pixel includes a photodiode, a floating diffusion region, a transfer transistor configured to transfer charge from the photodiode to the floating diffusion region, a source follower transistor, and a transistor that is coupled between the floating diffusion region and a power supply terminal. The floating diffusion region may be coupled to the source follower transistor and the source-follow transistor may be coupled to a column output line. The transistor may have a gate and the gate of the transistor may receive a control signal from a comparator that is coupled to the column output line.

The imaging pixel may also include a reset transistor coupled between the floating diffusion region and an additional power supply terminal. The imaging pixel may also include a row select transistor coupled between the source follower transistor and the column output line. The column output line may be coupled to a current source. The control signal from the comparator may be high when a voltage of the column output line is lower than a voltage of an anti-eclipse bias line. The transistor may be configured to be asserted when the control signal from the comparator is high. The comparator may be coupled to the column output line at a first input and the comparator may be coupled to an anti-eclipse bias line at a second input. The transistor may be configured to be asserted when a voltage of the column output line is lower than a voltage of an anti-eclipse bias line. The comparator may be coupled to the column output line at a negative input and the comparator may be coupled to an anti-eclipse bias line at a positive input.

In various embodiments, an imaging pixel that outputs image signals on a column output line may include a photosensitive region, a floating diffusion region, a transfer transistor coupled between the photosensitive region and the floating diffusion region, a source follower transistor coupled to the floating diffusion region and the column output line, a reset transistor coupled between the floating diffusion region and a first power supply terminal, and an anti-eclipse transistor coupled between the floating diffusion region and a second power supply terminal.

The imaging pixel may also include a row select transistor coupled between the source follower transistor and the column output line. The anti-eclipse transistor may be configured to be asserted when a voltage on the column output line is less than a threshold voltage. The anti-eclipse transistor may have a gate that receives a control signal from digital eclipse judgement circuitry. The anti-eclipse transistor may have a gate that receives an output signal from a comparator. The comparator may have a first input coupled to the column output line and a second input coupled to a bias line.

In various embodiments, an imaging sensor may include a plurality of pixels arranged in rows and columns, a plurality of column output lines, and a plurality of comparators. Each column output line may be coupled to a respective column of pixels, each comparator may have a first input that is coupled to a respective column output line, a second input that is coupled to an anti-eclipse bias line, and an output, and each pixel may include a photodiode, a floating diffusion region configured to receive charge from the photodiode, and an anti-eclipse transistor coupled between the floating diffusion region and a power supply terminal. Each anti-eclipse transistor has a gate coupled to the output of a comparator of the plurality of comparators.

Each pixel may also include a transfer transistor coupled between the photodiode and the floating diffusion region. Each pixel may also include a source follower transistor coupled to the floating diffusion region and a row select transistor coupled between the source follower transistor and a column output line of the plurality of column output lines. Each pixel also includes a reset transistor coupled between the floating diffusion region and an additional power supply terminal. The output of the comparator may be high when the first input is less than the second input and the anti-eclipse transistor may be configured to be asserted when the output of the comparator is high.

The foregoing is merely illustrative of the principles of this invention and various modifications can be made by those skilled in the art without departing from the scope and spirit of the invention.

What is claimed is:

1. An imaging pixel, comprising:
   a photodiode;
   a floating diffusion region;
   a transfer transistor configured to transfer charge from the photodiode to the floating diffusion region;
   a source follower transistor, wherein the floating diffusion region is coupled to the source follower transistor and wherein the source-follow transistor is coupled to a column output line;
   an additional transistor that is coupled between the floating diffusion region and a power supply terminal, wherein the additional transistor has a gate and wherein the gate of the additional transistor receives a control signal from a comparator that is coupled to the column output line; and
   a reset transistor coupled between the floating diffusion region and an additional power supply terminal, wherein the power supply terminal is configured to receive to a first voltage and wherein the additional power supply terminal is configured to receive a second voltage that is different from the first voltage.

2. The imaging pixel defined in claim 1, further comprising:
   a row select transistor coupled between the source follower transistor and the column output line.

3. The imaging pixel defined in claim 2, wherein the column output line is coupled to a current source.

4. The imaging pixel defined in claim 1, wherein the control signal from the comparator is high when a voltage of the column output line is lower than a voltage of an anti-eclipse bias line.

5. The imaging pixel defined in claim 4, wherein the additional transistor is configured to be asserted when the control signal from the comparator is high.

6. The imaging pixel defined in claim 1, wherein the comparator is coupled to the column output line at a first input and wherein the comparator is coupled to an anti-eclipse bias line at a second input.

7. The imaging pixel defined in claim 1, wherein the additional transistor is configured to be asserted when a voltage of the column output line is lower than a voltage of an anti-eclipse bias line.

8. The imaging pixel defined in claim 1, wherein the comparator is coupled to the column output line at a negative input and wherein the comparator is coupled to an anti-eclipse bias line at a positive input.

9. An imaging sensor comprising:
   a plurality of pixels arranged in rows and columns;
   a plurality of column output lines, wherein each column output line is coupled to a respective column of pixels; and
   a plurality of comparators, wherein each comparator has a first input that is coupled to a respective column output line, a second input that is coupled to an anti-eclipse bias line, and an output and wherein each pixel comprises:
   a photodiode;
   a floating diffusion region configured to receive charge from the photodiode;
   an anti-eclipse transistor coupled between the floating diffusion region and a power supply terminal, wherein each anti-eclipse transistor has a gate coupled to the output of a comparator of the plurality of comparators; and
   a reset transistor coupled between the floating diffusion region and an additional power supply terminal, wherein the power supply terminal is connected to a first voltage level and wherein the additional power supply terminal is connected to a second voltage level that is different from the first voltage level.

10. The imaging sensor defined in claim 9, wherein each pixel further comprises:

a transfer transistor coupled between the photodiode and the floating diffusion region.

11. The imaging sensor defined in claim 10, wherein each pixel further comprises:
a source follower transistor coupled to the floating diffusion region; and
a row select transistor coupled between the source follower transistor and a column output line of the plurality of column output lines.

12. The imaging sensor defined in claim 11, wherein the output of the comparator is high when the first input is less than the second input and wherein the anti-eclipse transistor is configured to be asserted when the output of the comparator is high.

* * * * *